United States Patent
Deshpande

(10) Patent No.: US 10,137,797 B2
(45) Date of Patent: Nov. 27, 2018

(54) BATTERY STATE OF CHARGE ESTIMATION BASED ON CURRENT PULSE DURATION

(71) Applicant: FORD GLOBAL TECHNOLOGIES, LLC, Dearborn, MI (US)

(72) Inventor: Rutooj D. Deshpande, Detroit, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 337 days.

(21) Appl. No.: 14/867,579

(22) Filed: Sep. 28, 2015

(65) Prior Publication Data

US 2017/0088002 A1    Mar. 30, 2017

(51) Int. Cl.
*G01R 31/36* (2006.01)
*B60L 11/18* (2006.01)

(52) U.S. Cl.
CPC ........ *B60L 11/1861* (2013.01); *G01R 31/362* (2013.01); *G01R 31/3651* (2013.01); *G01R 31/3662* (2013.01); *G01R 31/3624* (2013.01)

(58) Field of Classification Search
CPC .. G01R 31/36; G01R 31/362; G01R 31/3651; G01R 31/3662; G01R 31/3679; G01R 31/3624; G01R 31/3675; G01R 31/3637; G01R 31/361; B60L 11/1862; B60L 3/12; B60L 11/123; B60L 11/14; B60L 11/1816; B60L 11/1866; B60L 11/1868; B60L 11/1877; B60L 11/1861; B60W 20/00
USPC ......................................................... 702/63
See application file for complete search history.

(56) References Cited

U.S. PATENT DOCUMENTS

| 6,618,681 | B2 | 9/2003 | Hoenig et al. | |
|---|---|---|---|---|
| 8,193,777 | B2 | 6/2012 | Nakashima | |
| 2002/0075003 | A1 | 6/2002 | Fridman et al. | |
| 2010/0185405 | A1* | 7/2010 | Aoshima | B60L 3/0046 702/63 |
| 2011/0224928 | A1* | 9/2011 | Lin | G01R 31/3651 702/63 |
| 2012/0136595 | A1* | 5/2012 | Tang | H01M 10/425 702/63 |
| 2013/0080096 | A1* | 3/2013 | Toki | G01R 31/3624 702/63 |
| 2013/0218496 | A1* | 8/2013 | Koch | G01R 31/3651 702/63 |
| 2013/0320989 | A1* | 12/2013 | Inoue | G01R 31/3624 324/427 |
| 2015/0127280 | A1* | 5/2015 | Baba | H01M 10/48 702/63 |
| 2015/0276887 | A1* | 10/2015 | Shih | G01R 31/3679 702/63 |

(Continued)

FOREIGN PATENT DOCUMENTS

DE    102012222457 A1    6/2014

*Primary Examiner* — Tan T. Nguyen
(74) *Attorney, Agent, or Firm* — David Kelley; Brooks Kushman P.C.

(57) ABSTRACT

A vehicle includes a traction battery and a controller programmed to, in response to a duration of current flow through the traction battery exceeding a predetermined duration, output a state of charge based on a first resistance value that is greater than a second resistance value used when the duration is less than the predetermined duration to compensate for a change in voltage drop caused by diffusion processes within the traction battery.

18 Claims, 4 Drawing Sheets

(56) References Cited

U.S. PATENT DOCUMENTS

| | | | |
|---|---|---|---|
| 2016/0016482 A1* | 1/2016 | Lee | B60L 11/1861 701/22 |
| 2016/0041229 A1* | 2/2016 | Park | G01R 31/3624 702/63 |
| 2016/0052419 A1* | 2/2016 | Takahashi | H01M 10/48 429/61 |
| 2016/0178706 A1* | 6/2016 | Liu | G01R 31/3679 702/63 |
| 2016/0216336 A1* | 7/2016 | Ishii | H02J 7/0021 |
| 2016/0377684 A1* | 12/2016 | Leirens | G01R 31/3651 702/63 |

* cited by examiner

BATTERY STATE OF CHARGE ESTIMATION BASED ON CURRENT PULSE DURATION

TECHNICAL FIELD

This application is generally related to battery state of charge estimation.

BACKGROUND

Hybrid-electric vehicles and battery-electric vehicles include a traction battery to provide power to operate the vehicle. Operating parameters of the traction battery may be estimated to improve vehicle performance. For example, a state of charge of the traction battery may be estimated. The state of charge provides an indication of how much charge remains in the traction battery and is useful for initiating charging and discharging operations.

SUMMARY

In some configurations, a vehicle includes a traction battery. The vehicle also includes a controller programmed to, in response to a duration of a current flowing through the traction battery exceeding a predetermined duration, output a state of charge based on a first resistance value that is greater than a second resistance value used when the duration is less than the predetermined duration to compensate for a change in voltage drop caused by diffusion processes within the traction battery. Other configurations may include corresponding computer systems, apparatus, and computer programs recorded on one or more computer storage devices, each configured to perform the actions of the methods.

Some configurations may include one or more of the following features. The vehicle in which the first resistance value is based on at least one voltage measurement taken after a current pulse having duration greater than a predetermined time at which diffusion processes have reached a steady state. The vehicle in which the first resistance value is based on at least one voltage measurement taken after a current pulse having duration of at least one hundred seconds. The vehicle in which the second resistance value is based on at least one voltage measurement taken after a current pulse having duration less than a predetermined time at which diffusion processes have not reached a steady state. The vehicle in which the second resistance value is based on at least one voltage measurement taken after a current pulse having duration of ten seconds. The vehicle in which the first resistance value and the second resistance value are based on a magnitude of the current. The vehicle in which the first resistance value and the second resistance value are based on a temperature of the traction battery. The vehicle in which the first resistance value and the second resistance value are based on a terminal voltage of the traction battery. Implementation of the described configurations may include hardware, a method or process, or computer software on a computer-accessible medium.

In some configurations, a vehicle includes a traction battery configured to operate in a charge depleting mode. The vehicle also includes a controller programmed to output a state of charge during a discharge current pulse based on a resistance value that increases at least once as a duration of the discharge current pulse increases to compensate for a change in voltage drop caused by diffusion processes within the traction battery. Other configurations may include corresponding computer systems, apparatus, and computer programs recorded on one or more computer storage devices, each configured to perform the actions of the methods.

Some configurations may include one or more of the following features. The vehicle in which the controller is further programmed to increase the resistance value in response to the duration being greater than a predetermined duration. The vehicle in which the controller is further programmed to operate the traction battery according to the state of charge. The vehicle in which the resistance value is further based on a terminal voltage of the traction battery, a temperature of the traction battery, and a magnitude of the discharge current pulse. The vehicle in which the resistance value is derived from one of a plurality of characteristic tables selected based on the duration.

In some configurations, a method includes generating a plurality of resistance tables, each corresponding to operating a battery at current pulses of different durations. The method also includes storing the resistance tables in non-volatile memory of a controller. The method also includes outputting, by the controller, a state of charge based on a resistance value from one of the resistance tables that is selected based on a duration of a current pulse applied during battery operation. Other configurations may include corresponding computer systems, apparatus, and computer programs recorded on one or more computer storage devices, each configured to perform the actions of the methods.

Some configurations may include one or more of the following features. The method in which at least one of the current pulses is of duration such that diffusion processes of the battery have reached a steady state. The method in which at least one of the current pulses is of duration greater than one hundred seconds. The method in which at least one of the current pulses is of duration such that diffusion processes of the battery are in a transient state. The method in which at least one of the current pulse is of duration less than or equal to ten seconds. The method in which the resistance value is selected from the one of the resistance tables based on a terminal voltage, a battery temperature, and a current magnitude. Implementation of the described configurations may include hardware, a method or process, or computer software on a computer-accessible medium.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
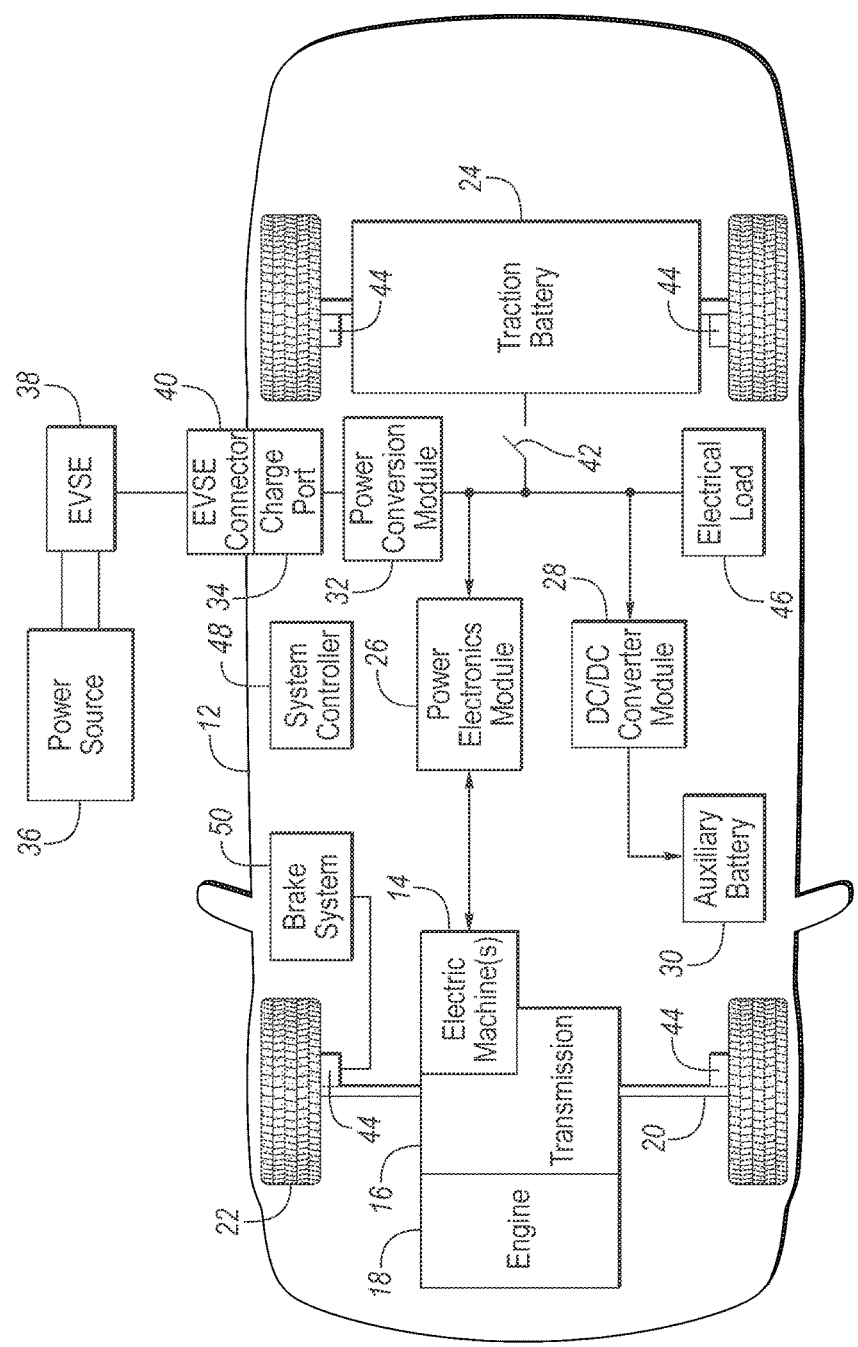
FIG. 1 is a diagram of a hybrid vehicle illustrating typical drivetrain and energy storage components.

FIG. 1 depicts a typical plug-in hybrid-electric vehicle (PHEV). A typical plug-in hybrid-electric vehicle 12 may comprise one or more electric machines 14 mechanically coupled to a hybrid transmission 16. The electric machines 14 may be capable of operating as a motor or a generator. In addition, the hybrid transmission 16 is mechanically coupled to an engine 18. The hybrid transmission 16 is also mechanically coupled to a drive shaft 20 that is mechanically coupled to the wheels 22. The electric machines 14 can provide propulsion and deceleration capability when the engine 18 is turned on or off. The electric machines 14 also act as generators and can provide fuel economy benefits by recovering energy that would normally be lost as heat in a friction braking system. The electric machines 14 may also reduce vehicle emissions by allowing the engine 18 to operate at more efficient speeds and allowing the hybrid-electric vehicle 12 to be operated in electric mode with the engine 18 off under certain conditions.

A traction battery or battery pack 24 stores energy that can be used by the electric machines 14. A vehicle battery pack 24 typically provides a high voltage DC output. The traction battery 24 is electrically coupled to one or more power electronics modules. One or more contactors 42 may isolate the traction battery 24 from other components when opened and connect the traction battery 24 to other components when closed. The power electronics module 26 is also electrically coupled to the electric machines 14 and provides the ability to bi-directionally transfer energy between the traction battery 24 and the electric machines 14. For example, a traction battery 24 may provide a DC voltage while the electric machines 14 may operate with a three-phase AC current to function. The power electronics module 26 may convert the DC voltage to a three-phase AC current to operate the electric machines 14. In a regenerative mode, the power electronics module 26 may convert the three-phase AC current from the electric machines 14 acting as generators to the DC voltage compatible with the traction battery 24. The description herein is equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A vehicle 12 may include a DC/DC converter module 28 that converts the high voltage DC output of the traction battery 24 to a low voltage DC supply that is compatible with low-voltage vehicle loads. An output of the DC/DC converter module 28 may be electrically coupled to an auxiliary battery 30 (e.g., 12V battery). The low-voltage systems may be electrically coupled to the auxiliary battery. Other high-voltage loads 46, such as compressors and electric heaters, may be coupled to the high-voltage output of the traction battery 24.

The vehicle 12 may be an electric vehicle or a plug-in hybrid vehicle in which the traction battery 24 may be recharged by an external power source 36. The external power source 36 may be a connection to an electrical outlet. The external power source 36 may be electrically coupled to a charger or electric vehicle supply equipment (EVSE) 38. The external power source 36 may be an electrical power distribution network or grid as provided by an electric utility company. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically coupled to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically coupled or connected may transfer power using a wireless inductive coupling.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 50. The brake system 50 may include other components to operate the wheel brakes 44. For simplicity, the figure depicts a single connection between the brake system 50 and one of the wheel brakes 44. A connection between the brake system 50 and the other wheel brakes 44 is implied. The brake system 50 may include a controller to monitor and coordinate the brake system 50. The brake system 50 may monitor the brake components and control the wheel brakes 44 for vehicle deceleration. The brake system 50 may respond to driver commands and may also operate autonomously to implement features such as stability control. The controller of the brake system 50 may implement a method of applying a requested brake force when requested by another controller or sub-function.

One or more electrical loads 46 may be coupled to the high-voltage bus. The electrical loads 46 may have an associated controller that operates and controls the electrical loads 46 when appropriate. Examples of electrical loads 46 may be a heating module or an air-conditioning module.

Electronic modules in the vehicle 12 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 30. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 12. A vehicle system controller (VSC) 48 may be present to coordinate the operation of the various components.

Figure 2:
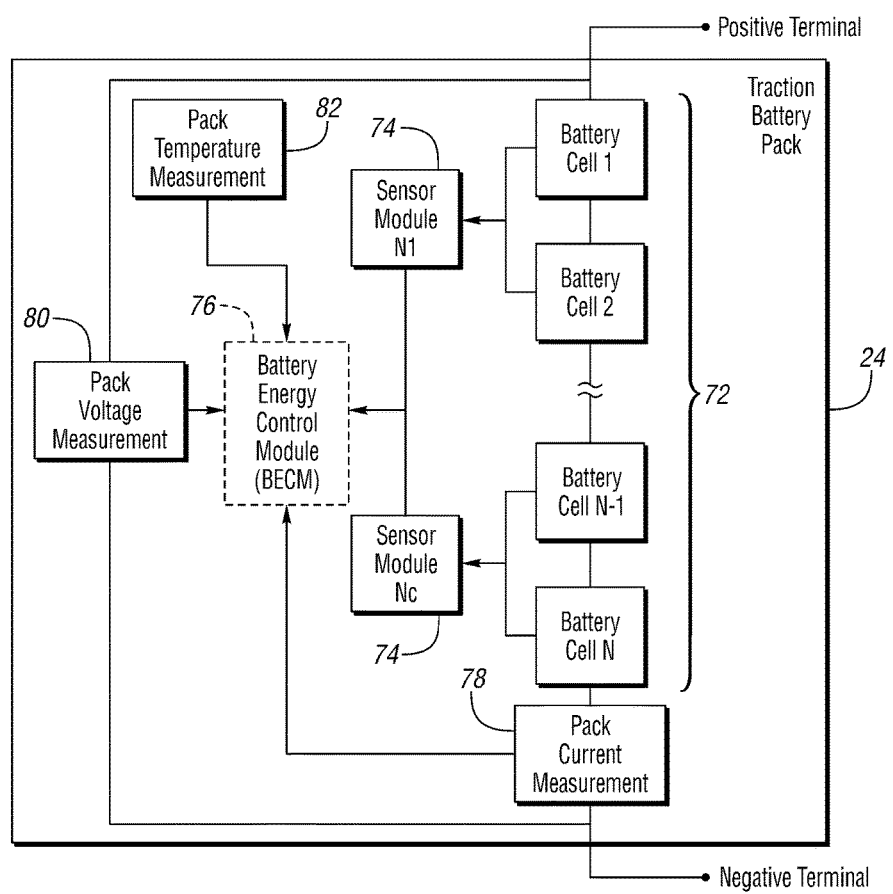
FIG. 2 is a diagram of a possible battery pack arrangement comprised of multiple cells, and monitored and controlled by a Battery Energy Control Module.

A traction battery 24 may be constructed from a variety of chemical formulations. Typical battery pack chemistries may be lead acid, nickel-metal hydride (NIMH) or Lithium-Ion. FIG. 2 shows a typical traction battery pack 24 in a simple series configuration of N battery cells 72. Other battery packs 24, however, may be composed of any number of individual battery cells connected in series or parallel or some combination thereof. A battery management system may have a one or more controllers, such as a Battery Energy Control Module (BECM) 76, that monitor and control the performance of the traction battery 24. The battery pack 24 may include sensors to measure various pack level characteristics. The battery pack 24 may include one or more pack current measurement sensors 78, pack voltage measurement sensors 80, and pack temperature measurement sensors 82. The BECM 76 may include circuitry to interface with the pack current sensors 78, the pack voltage sensors 80 and the pack temperature sensors 82. The BECM 76 may have non-volatile memory such that data may be retained when the BECM 76 is in an off condition. Retained data may be available upon the next key cycle.

In addition to the pack level characteristics, there may be battery cell 72 level characteristics that are measured and monitored. For example, the terminal voltage, current, and temperature of each cell 72 may be measured. A system may use a sensor module 74 to measure the battery cell 72 characteristics. Depending on the capabilities, the sensor module 74 may measure the characteristics of one or multiple of the battery cells 72. The battery pack 24 may utilize up to $N_c$ sensor modules 74 to measure the characteristics of all the battery cells 72. Each sensor module 74 may transfer the measurements to the BECM 76 for further processing and coordination. The sensor module 74 may transfer signals in analog or digital form to the BECM 76. In some configurations, the sensor module 74 functionality may be incorporated internally to the BECM 76. That is, the sensor module 74 hardware may be integrated as part of the circuitry in the BECM 76 and the BECM 76 may handle the processing of raw signals. The BECM 76 may also include circuitry to interface with the one or more contactors 42 to open and close the contactors 42.

It may be useful to calculate various characteristics of the battery pack. Quantities such a battery power capability and battery state of charge may be useful for controlling the operation of the battery pack as well as any electrical loads receiving power from the battery pack. Battery power capability is a measure of the maximum amount of power the battery can provide or the maximum amount of power that the battery can receive. Knowing the battery power capability allows the electrical loads to be managed such that the power requested is within limits that the battery can handle.

Battery pack state of charge (SOC) gives an indication of how much charge remains in the battery pack. The SOC may be expressed as a percentage of the total charge remaining in the battery pack. The battery pack SOC may be output to inform the driver of how much charge remains in the battery pack 24, similar to a fuel gauge. The battery pack SOC may also be used to control the operation of an electric or hybrid-electric vehicle. Calculation of battery pack SOC can be accomplished by a variety of methods. One possible method of calculating battery SOC is to perform an integration of the battery pack current over time. This is well-known in the art as ampere-hour integration.

The traction battery may be charged or discharged at different rates. The rate of charge and discharge may be expressed as a C-rate. The traction battery 24 may have a rated capacity which may be expressed in Amp-hours. For example, a 1-C discharge rate may be defined as drawing a current equivalent to the rated capacity such that the battery is discharged in one hour. A 10-C discharge rate may draw current ten times greater than the rated capacity and discharge the battery in one-tenth of an hour. A 0.1-C discharge rate may draw a current one tenth of the rated capacity and discharge the battery in ten hours.

The BECM 76 may operate the traction battery 24 to manage the state of charge of the traction battery 24. The traction battery 24 may be charged or discharged according to a target state of charge compared to a present state of charge. For example, when the present state of charge is greater than the target state of charge, the traction battery may be discharged. Operation of the traction battery 24 may be achieved by commanding a torque of the electric machines 14 to draw current from or provide current to the traction battery 24. Operation of the traction battery 24 may further involve commanding operation of the engine 18 to provide power to the electric machines 14.

Figure 3:
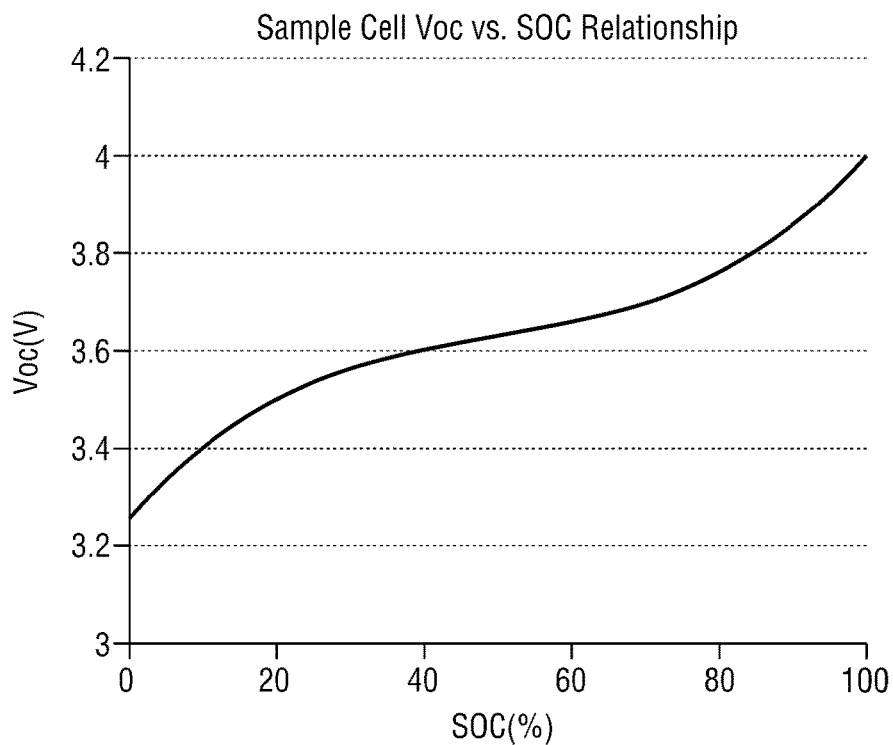
FIG. 3 depicts a possible relationship between open-circuit voltage and state of charge of a traction battery.

The state of charge of a battery cell 72 may be related to an open-circuit voltage of the battery cell 72. One possible relationship is depicted in FIG. 3. The relationship between the open-circuit voltage and the state of charge may be derived from testing. To use the relationship to determine state of charge, the open-circuit voltage should be known with a high degree of accuracy. However, while the traction battery 24 is operating, only the terminal voltage may be measured and known to the controller 76. During operation, the terminal voltage and the open-circuit voltage may not be the same.

Figure 4:
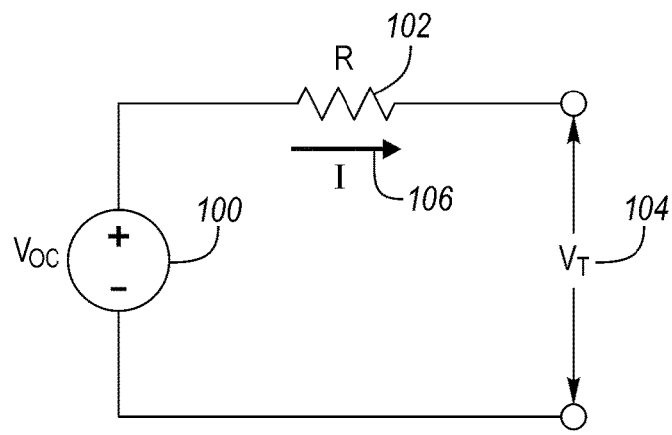
FIG. 4 depicts a possible model for a traction battery.

A difference between the terminal voltage and the open-circuit voltage may be a function of a battery resistance and a current that is flowing through the resistance. The battery cell 72 may be modeled as a circuit that includes a resistance value. A simplified model of a circuit representing a battery cell is depicted in FIG. 4. Note that other models may be utilized.

The circuit model of the battery cell 72 may include a voltage source 100 that represents the open-circuit voltage of the battery cell 72. The circuit model may include a resistance 102 between the voltage source and the terminals of the battery cell 72. A terminal voltage 104 of the battery cell 72 may be defined as the voltage across the terminals of the battery cell 72. In practice, the terminal voltage 104 of the battery may be measured. Under limited conditions, the terminal voltage 104 may be the same as the open-circuit voltage 100. For example, after a period of rest (e.g., zero current flowing through the battery cell), the terminal voltage 104 may equalize to the open-circuit voltage 100. However, while a current 106 is flowing through the battery cell 72, the terminal voltage 104 and the open-circuit voltage 100 are not necessarily the same value. While the current 106 is flowing through the battery cell 72, the resistance 102 and current magnitude determine the relationship between the open-circuit voltage 100 and the terminal voltage 104.

The relationship may be expressed as:

$$V_{OC}=V_T+IR \tag{1}$$

The resistance 102, R, may be affected by temperature. The open-circuit voltage 100 may be computed if the terminal voltage 104, the current 106, and the resistance 102 are known. The terminal voltage 104 may be measured using a voltage sensor. The current 106 flowing through the battery cell 72 may be measured by a current sensor. The resistance value may be experimentally derived based on prior testing. Further, a relationship between resistance 102 and temperature may be determined based on prior test data. Further, if the open-circuit voltage 100 is known, the state of charge may be computed based on a representation as in FIG. 3. This information may be combined into a lookup table referred to as a Voltage, Current, Temperature (VIT) table.

The VIT table may be computed off-line and stored in non-volatile memory of the battery controller 76. The table may be configured to output a state of charge based on terminal voltage 104, battery current 106, and battery temperature. During operation, the battery controller 76 may measure the terminal voltage 104, the battery current 106, and the battery temperature. The terminal voltage 104, the battery current 106, and the battery temperature may be used to index into the table to yield a state of charge value. Note that the VIT table may be constructed for a single cell, a combination of cells, and/or the entire battery pack.

The VIT table may be populated by collecting measurement data under various conditions. A series of measurements may be taken while maintaining the battery at a constant temperature level. At a given battery temperature, the traction battery 24 may be discharged from a first state of charge to a second state of charge at different constant discharge rates (e.g., constant current levels). The open-circuit voltage of the battery may be known at the first state of charge and the second state of charge based on FIG. 3. The voltage drop may be a function of the product of the current and the battery resistance at the second state of charge. The resistance value may be computed as:

$$R = \frac{V_{OC} - V_T}{I} \qquad (2)$$

where $V_{oc}$ is the open-circuit voltage at the second state of charge, $V_T$ is the terminal voltage measured at the second state of charge, and I is the constant current level. The test may be repeated at different temperatures, different discharge rates, and different starting and ending states of charge. Ultimately, a table of resistance values may be determined that is indexed by terminal voltage, current, and temperature.

In such a system, the accuracy of the state of charge is dependent upon the accurate population of the VIT table. In some vehicle configurations, such a hybrid vehicle, a majority of charge and discharge current pulses may be of relatively short duration (e.g., under ten seconds). In hybrid vehicle applications, a single VIT table may be used that has values representative of the relatively short duration pulses. For example, testing may be performed with current pulses of ten second duration at a variety of temperatures and states of charge. Data from this testing may be used to populate the VIT table.

PHEV and BEV configuration, which may operate in a charge depleting mode, may allow for longer current pulses. For example, a BEV operating at a cruising speed may be discharging the traction battery 24 with a long duration current pulse (e.g., minutes). The characteristics of the battery cells 72 may be different based on the duration of the current pulse. During a long current pulse, the electrochemical state of the battery cells 72 may reach a steady-state condition. During a short current pulse, the electrochemical state of the battery cells 72 may be in a transient state. As a result, the resistance of the battery cells 72 may change during the current pulse until a steady-state resistance value is reached.

In some configurations, the battery controller 76 may compute an amp-hour integration by accumulating current measurements over time. The controller 76 may also compute a state of charge based on the VIT table. The system may periodically compare the amp-hour integration state of charge with the VIT-based state of charge. If the states of charge differ by more than a predetermined amount, the state of charge may be adjusted. The battery controller 76 may be programmed to output the state of charge for other controllers to use.

The change in resistance may be caused by the various chemical processes that occur in the battery cell. The voltage drop across the battery cells may change during a current pulse. Ionic diffusion in the electrolyte represents the distribution of lithium ions across the electrolyte layer. The diffusion process takes time and eventually a steady-state voltage is reached. At rest (e.g., no current flowing through the battery cell), the concentration of lithium LiPF6 throughout the electrolyte may be uniform. Upon application of current, the LiPF6 concentration profile steadily changes and eventually reaches a steady state. The time to reach the steady state may be on the order of 100 to 200 seconds. The effect of this may be seen as an increasing voltage drop across the cell and, hence, an increase in resistance.

Further affecting the resistance of the battery cell are solid state diffusion processes in the electrodes. When the battery is at rest, the Li concentration throughout the electrode may be uniform. Upon application of current, the Li concentration profile steadily changes and reaches steady state after a period of time. The period of time may again be on the order of 100 to 200 seconds. The effect is that the voltage drop between the terminals changes over time until the steady-state conditions are reached.

The net effect of the diffusion processes is that the resistance of the battery cell varies as the duration of the current pulse increases. Therefore, using a single characteristic table based on a single predetermined pulse duration may yield less accurate results during operation when the current pulse durations are different than those used to derive the characteristic table. To resolve this issue, multiple characteristic tables based on different pulse durations may be employed. The additional characteristic tables may compensate for changes in the voltage drop caused by diffusion processes within the traction battery 24.

For example, a second characteristic table may be derived from long-duration current pulses. Data may be collected during long-duration current pulses that are selected to cause steady-state conditions to be reached. For example, current pulses of 100 to 200 seconds may be applied to collect the data. A long-duration VIT table may be created based on the data. Battery voltages and temperatures may be measured after application of the long current pulses and resulting data stored in the long-duration VIT table. The process may be repeated at a number of combinations of states of charge, current magnitudes, and battery temperatures. It may be expected that as the duration of the current pulse increases, the resistance values will increase until a steady state voltage drop is reached.

During operation of the traction battery 24, the battery controller 76 may monitor the duration of current polarity to select one of the VIT tables. For example, a first VIT table may be derived from short-term current pulses (e.g., 10 seconds) and a second VIT table may be derived from long-term current pulses (e.g., 200 seconds). The first and second VIT tables may be stored in non-volatile memory of the battery controller 76. During vehicle operation, the current flowing through the traction battery 24 may be monitored by the battery controller 76. The duration of the current during periods of current flow at a given polarity (positive or negative) may be monitored. In response to the duration of the current flow being less than a predetermined duration, the first VIT table may be used to determine the state of charge. In response to the duration of the current flow being greater than or equal to the predetermined duration, the second VIT table may be used to determine the state of charge. The second VIT table may provide a resistance value that is greater than that provided by the first VIT table.

The predetermined duration may be selected to be a value between the short-term current pulse time and the long-term current pulse time. For example, the predetermined duration may be selected as the average of the short-term pulse time and the long-term pulse time. In other configurations, the predetermined duration may be selected to correspond to one of the short-term pulse time or the long-term pulse time.

In some configurations, additional characteristic tables may be generated for a variety of current pulse durations. For example, characteristic tables may be generated at current pulse intervals of 10 seconds up to the steady-state current pulse duration (e.g., one hundred seconds). Such an approach may improve accuracy of the state of charge computation. One constraint may be the amount non-volatile memory that is available to store the characteristic table data.

The resulting battery management system provides an improved estimate of battery SOC as the resistance values are compensated for diffusion processes within the traction battery. Assuming two different current pulse durations for which the terminal voltage, current magnitude, and temperature are the same, a different SOC value may be output based on the duration.

In some configurations, the traction battery 24 may be operating in a charge depleting mode. During a discharge current pulse, the resistance value may be increased at least once during the discharge current pulse. As the duration of the discharge current pulse increases, the predetermined duration may be surpassed, at which time, a different VIT table may be selected which has a larger resistance value. In some configurations that use more than two VIT tables, the resistance value may increase several times as the duration increases.

Figure 5:
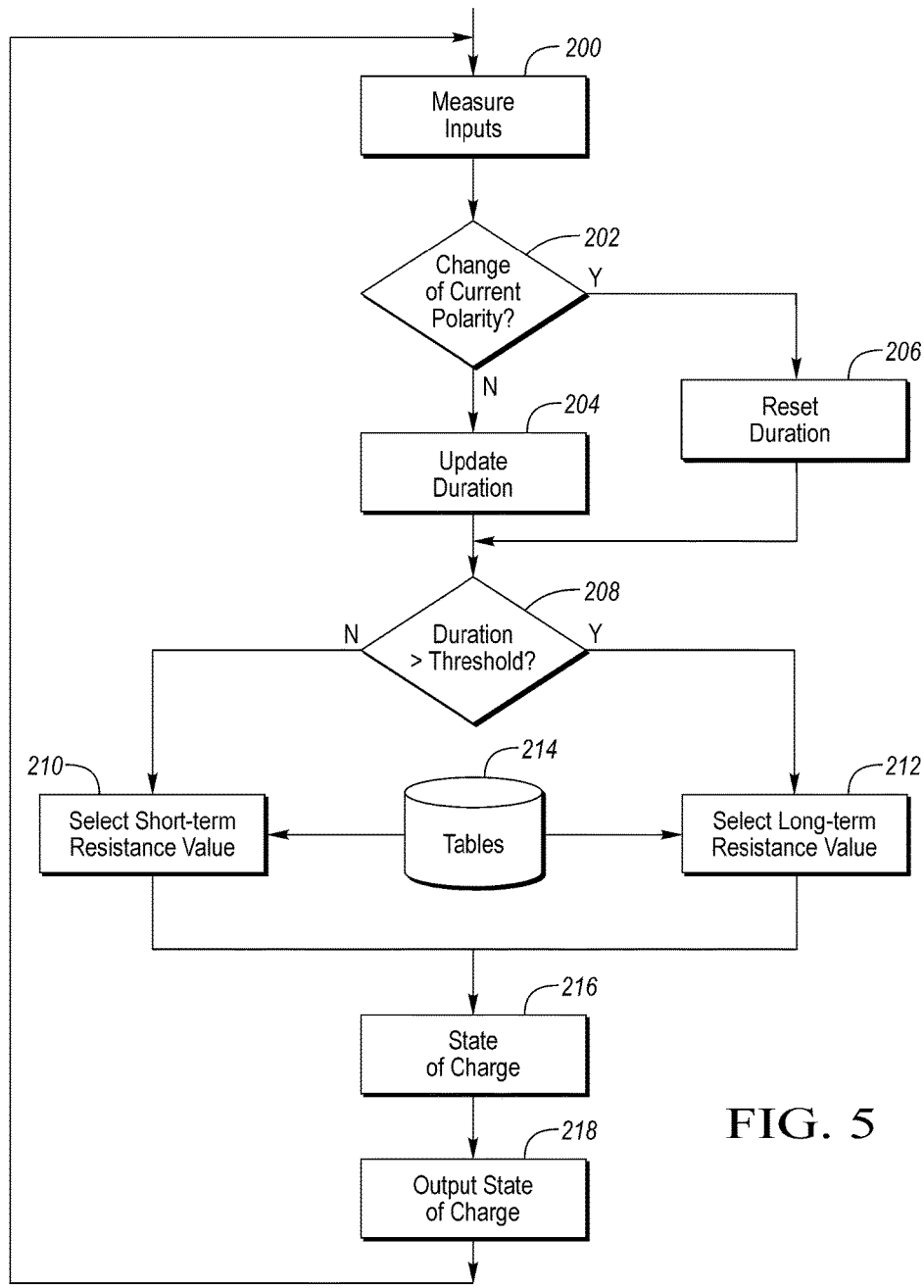
FIG. 5 depicts a possible flow chart for controller implemented operations for generating a state of charge for the traction battery.

FIG. 5 depicts a flowchart of a possible sequence of operations to compute and output the state of charge of the traction battery 24. At operation 200, the input values may be measured. The input values may include battery current, terminal voltage, and battery temperature. At operation 202, a polarity (e.g., positive or negative) of the battery current may be checked to determine if the polarity has changed (e.g., positive to negative) from a previous execution loop. If the polarity has changed, operation 206 may be performed to reset a duration associated with the current polarity. If the polarity has not changed, operation 204 may be performed in which the duration may be updated with the time elapsed since the previous execution loop. The duration value may be maintained as a counter that is incremented periodically. After operations 204 and 206 are complete, operation 208 may be performed to check the duration. If the duration is less than or equal to a threshold, operation 210 may be performed. If the duration is greater than the threshold, operation 212 may be performed. Operations 210 and 212 may access a database of tables 214 that are stored in non-volatile memory of the controller 76. The tables 214 may be populated as described and may include a plurality of resistance tables indexed by voltage, current, and temperature. Operation 210 may select a short-term resistance value from the database while operation 212 may select a long-term resistance value. At operation 216, the state of charge of the traction battery 24 may be computed based on the selected resistance value. At operation 218, the state of charge value may be output for controlling the traction battery 24. Operation may return at a next execution loop to operation 200.

In some configurations, the state of charge may be computed and output after operation 206. This may prevent the resistance value from changing during a current pulse until the duration of the current pulse is known.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A vehicle comprising:
   a traction battery; and
   a controller coupled to the traction battery to operate the traction battery according to a state of charge derived from a resistance value and, in response to a duration of current flow through the traction battery exceeding a predetermined duration, change the resistance value from a second resistance value to a first resistance value that is greater than the second resistance value to compensate the state of charge for a change in voltage drop caused by diffusion processes within the traction battery.

2. The vehicle of claim 1 wherein the first resistance value is based on at least one voltage measurement taken after a current pulse having duration greater than a predetermined time at which diffusion processes have reached a steady state.

3. The vehicle of claim 1 wherein the first resistance value is based on at least one voltage measurement taken after a current pulse having duration of at least one hundred seconds.

4. The vehicle of claim 1 wherein the second resistance value is based on at least one voltage measurement taken after a current pulse having duration less than a predetermined time at which diffusion processes have not reached a steady state.

5. The vehicle of claim 1 wherein the second resistance value is based on at least one voltage measurement taken after a current pulse having a duration of ten seconds.

6. The vehicle of claim 1 wherein the first resistance value and the second resistance value are based on a magnitude of the current.

7. The vehicle of claim 1 wherein the first resistance value and the second resistance value are based on a temperature of the traction battery.

8. The vehicle of claim 1 wherein the first resistance value and the second resistance value are based on a terminal voltage of the traction battery.

9. A vehicle comprising:
a traction battery; and
a controller coupled to the traction battery to operate the traction battery during a discharge current pulse in a charge depleting mode according to a state of charge derived from a resistance value and increase the resistance value at least once as a duration of the discharge current pulse increases to compensate the state of charge for a change in voltage drop caused by diffusion processes within the traction battery.

10. The vehicle of claim 9 wherein the controller is further programmed to increase the resistance value in response to the duration being greater than a predetermined duration.

11. The vehicle of claim 9 wherein the resistance value is further based on a terminal voltage of the traction battery, a temperature of the traction battery, and a magnitude of the discharge current pulse.

12. The vehicle of claim 9 wherein the resistance value is derived from one of a plurality of characteristic tables selected based on the duration.

13. A method for operating a traction battery by a controller comprising:
charging and discharging, the traction battery according to a state of charge derived from a resistance value selected from one of a plurality of resistance tables based on a duration of a current pulse applied during traction battery operation, each resistance table corresponding to operating the traction battery at current pulses of different durations and being stored in non-volatile memory of the controller.

14. The method of claim 13 wherein at least one of the current pulses is of duration such that diffusion processes of the battery have reached a steady state before the duration.

15. The method of claim 13 wherein at least one of the current pulses is of duration greater than one hundred seconds.

16. The method of claim 13 wherein at least one of the current pulses is of duration such that diffusion processes of the battery are in a transient state after the duration.

17. The method of claim 13 wherein at least one of the current pulse is of duration less than or equal to ten seconds.

18. The method of claim 13 wherein the resistance value is selected from the one of the resistance tables based on a terminal voltage, a battery temperature, and a current magnitude.

* * * * *